United States Patent

Dushkes et al.

[15] 3,653,572

[45] Apr. 4, 1972

[54] HOT GAS SOLDER REMOVAL

[72] Inventors: Sherman Z. Dushkes, Redwood City, Calif.; Conrad Trollmann, Sindelfingen, Germany

[73] Assignee: International Business Machines Corporation, Armonk, N.Y.

[22] Filed: Sept. 5, 1969

[21] Appl. No.: 855,519

[52] U.S. Cl. .................................... 228/20, 34/187, 118/63

[51] Int. Cl. .................................................... B23k 1/20

[58] Field of Search .................... 118/63, 52.5 Y; 117/102 L, 117/102 M; 228/20; 34/187, 232; 75/63

[56] References Cited

UNITED STATES PATENTS

| | | | |
|---|---|---|---|
| 3,435,801 | 4/1969 | Carini et al. | 118/63 |
| 3,230,615 | 1/1966 | Krengel et al. | 118/63 X |
| 1,124,727 | 1/1915 | Greenfield | 118/63 |
| 3,200,788 | 8/1965 | Tardoskegy | 118/54 X |
| 3,359,132 | 12/1967 | Wittmann | 118/54 X |

FOREIGN PATENTS OR APPLICATIONS

| | | | |
|---|---|---|---|
| 239,042 | 3/1960 | Australia | 118/48 |

OTHER PUBLICATIONS

IBM Technical Disclosure Bulletin, " Removing Excess Solder" Donovan, Jr., Vol. 5 No. 4 Sept. 1962– pp. 19, 20

*Primary Examiner*—Morris Kaplan
*Attorney*—Hanifin and Jancin and Wm. J. Kopacz

[57] ABSTRACT

Disclosed is a device for preparing solder coated leads for the final soldering operation. Excess solder is stripped from the solder coated leads by immersing these leads into streams of hot, dry gas. This stream of gas melts and flows away excess solder. A thin coating of solder is retained on the leads. The gas is preferably inert and the process takes place in a chamber which is substantially free of oxygen. This retained solder is ultimately used in the final bonding operation of the lead to a circuit board.

4 Claims, 2 Drawing Figures

*INVENTORS.*
SHERMAN Z. DUSHKES
CONRAD TROLLMANN
*BY* Wm J Kogan
ATTORNEY

HOT GAS SOLDER REMOVAL

BACKGROUND OF THE INVENTION

Integrated circuit chip leads are bound to a circuit board by means of solder reflow techniques. The chip leads are first coated with solder by immersing the leads into molten solder. The solder cools and hardens on the leads. The chip is then placed on the circuit board with the solder coated leads in contact with the appropriate circuit board lands. The leads are then heated, melting the solder, and thereby bonding the chip to the circuit board.

A proper initial coating of the leads with solder is difficult to obtain because of the extremely small size of the leads. The leads of some chips are 0.006 inch wide and 0.005 inch apart. The leads can be even smaller. A typical chip may have 44 leads or more. When these leads are immersed into the bath of molten solder, an excessive amount of solder collects on the leads. Many of the leads will be connected together or bridged by a sheet of solder. Even those leads which are not bridged are coated with excess solder. If a lead containing excess solder is bound to a circuit board, the solder will spread out when melted causing short circuits between the lead and other electrical elements.

There existed a need for a method of removing excess solder from chip leads without contaminating or bending the leads. If a hot liquid such as oil is used to melt and flow away excess solder, the chip leads become contaminated. If the leads are cleaned by a heated solid object, such as a miniature soldering iron, there is a great danger that the fragile leads will be bent. Also, the solder removal method would have to leave a sufficient amount of solder on each chip lead so that a proper bond could ultimately be made.

It is an object of this invention to provide a method for removing excess solder without contamination of the solder bearing surface.

It is an object of the present invention to provide a method of removing excess solder without damage to the solder bearing surface.

It is a further object of this invention to provide a method that will remove excess solder while leaving a thin coat of retained solder.

It is a further object of the present invention to provide a solder removal device for preparing integrated circuit chip leads for the final bonding operation.

SUMMARY OF THE INVENTION

According to the teaching of this invention, excess solder removal is carried out by directing a stream of dry, hot gas at the solder coated surface. The gas is heated to a temperature greater than that of the melting point of the solder. The stream of hot gas melts and blows away excess solder. The gas used must not contain oxygen or other materials which will combine with the molten solder. Inert gas is ideal.

BRIEF DESCRIPTION OF THE DRAWINGS

FIGS. 1 and 2 show an excess removal device wherein streams of hot gas are used to melt and blow away the excess solder which coats the leads of an integrated circuit chip. The gas emanates from jets which are contained in a cleaning chamber. The circuit chip is positioned in the cleaning chamber so that one of the four banks of leads is positioned in the streams of hot gas. There are four banks of leads, one bank on each of the four sides of the chip. The chip is rotated so that every lead on the chip will pass through the streams of hot gas. After all four banks of leads have been cleaned, the chip is withdrawn from the chamber.

DESCRIPTION OF THE PREFERRED EMBODIMENT

Figure 1:
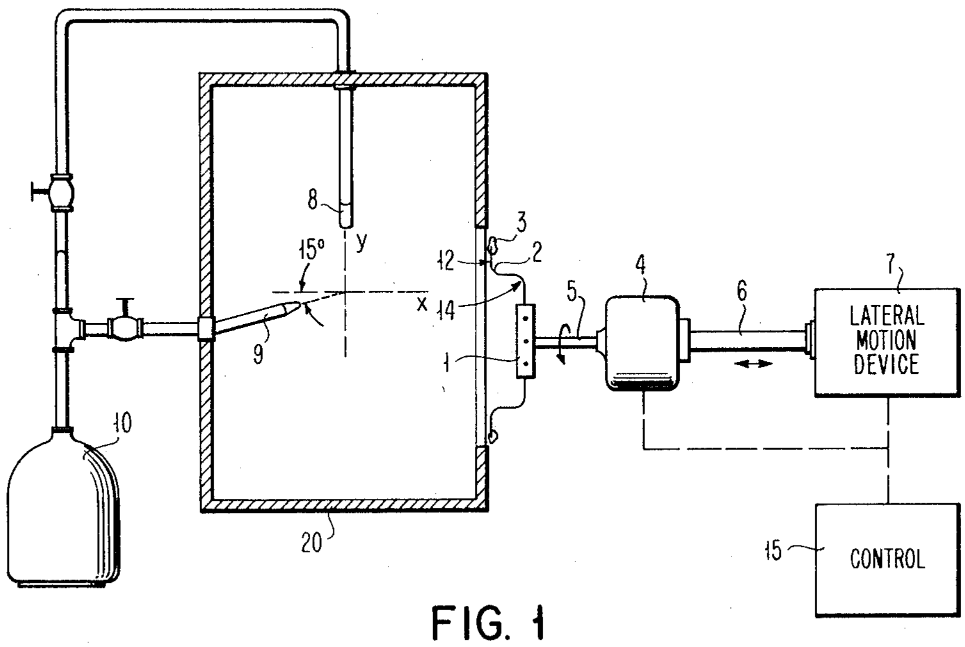
FIG. 1 is a side view of a device constructed in accordance with the teachings of this invention.
Figure 2:
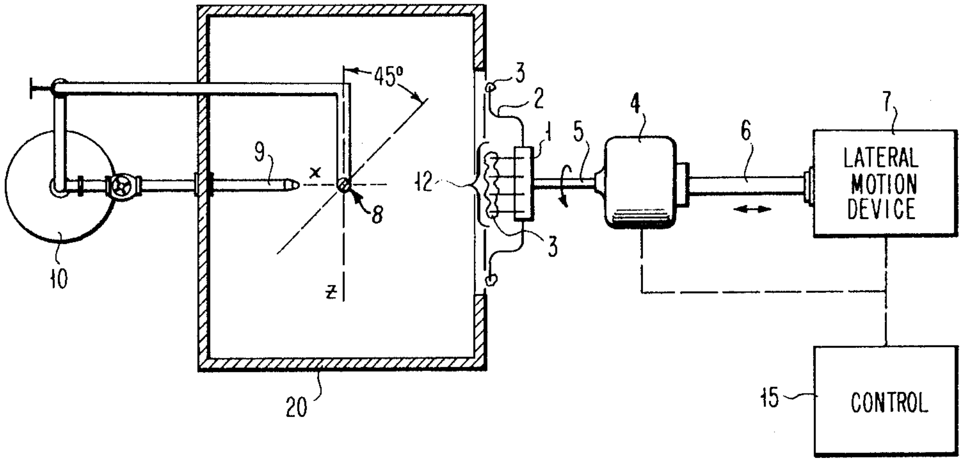
FIG. 2 is a top view of a device constructed in accordance with the teachings of this invention.

Referring to FIGS. 1 and 2, there is shown an integrated circuit chip 1 bearing leads 2. Leads 2 are coated with an excessive amount of solder 3. FIG. 2 shows the solder bridging the adjacent leads 2. Each of the four sides of the chip carries a bank of leads; there are 11 leads per bank. Bank 12, seen in FIGS. 1 and 2, will be the first to be cleaned.

Chip 1 is connected to a motor 4 of conventional construction by means of stud 5. Lateral motion device 7 is connected to motor 4 by means of rod 6.

Hot gas jets 8 and 9 are connected to gas heating chamber 10, which contains the gas under pressure. Jet 8 is situated in a vertical plane while jet 9 is positioned 15° below the horizontal. Jet 8 has an elongated oval shaped orifice as seen in FIG. 2. As seen in FIG. 2, the major axis of the orifice of jet 8 is at a 45° angle with the imaginary line defined by the ends of chip leads 2. Gas jets 8 and 9 are enclosed in cleaning chamber 20. As seen in FIG. 1, there is an opening in chamber 20, which opening is large enough to accommodate chip 1. Chamber 20 is preferably made of a transparent material, such as quartz, so that the cleaning operation can be observed.

In operation, the gas jets are opened, allowing hot gas to blow about chamber 20 and escape the chamber through the opening. The opening in the chamber is shown to be far larger than it is in actuality. In fact, the chip 1 and the opening are quite small relative to the other elements. Oxygen is excluded from the chamber 20 by the pressure created by the hot gas which blows out of the chamber through the opening.

Lateral motion device 7 positions solder coated chip leads 2 directly beneath vertical hot gas jet 8. The solder 3 is heated by the gas escaping from the jet 8. The solder melts and is carried away from the chip leads 2 by the stream of hot gas. A thin coating of solder will remain on the leads due to the surface tension of the solder.

Motor 4 rotates chip 1. Each lead will then pass through the hot gas stream. Gas jet 8 orifice is elongated and at an angle of 45° as aforementioned. This shape assures that a maximum area of the chip leads will have direct contact with the hot gas stream while a minimum amount of gas will be used. As pointed out above, chip 1 has leads on all four sides. The rotation of motor 1 will bring each of the four banks of leads into position below jet 8.

After motor 4 has rotated chip 1 through 360°, lateral motion device 7 withdraws the chip.

It has been found that some of the melted solder tends to collect at the top bend of chip leads 2. This area is shown in FIG. 1 with reference numeral 14. This bend or knee 14 is cleaned by gas jet 9. If gas jet 9 is positioned 15° below the horizontal, particularly effective cleaning of knee 14 is obtained.

The entire operation is supervised by control 15. Control 15 directs lateral motion device 7 and motor 4. Control 15, which can be a general purpose computer of conventional design, coordinates such interdependent facts as the melting point of the particular solder being used, the temperature of the gas, and the shape and width of the solder coated leads with the speed of rotation of motor 4 and the timing of lateral motion device 7.

Of course, the entire operation can be supervised by a human operator. The operator would view the cleaning through the transparent chamber 20. Conventional control circuitry would be connected to positioning devices 4 and 7.

While the invention has been particularly shown and described, it will be understood by those skilled in the art that changes in form and details may be made without departing from the spirit and scope of the invention. For example, the number and position of gas jets can be varied so that various shaped solder coated surfaces can be efficiently cleaned of excess solder.

What is claimed is:

1. A device for preparing a member, having a thick solder coating, for a solder reflow operation comprising:

a source of oxygen-free, pressurized, heated gas, said gas being heated to a temperature greater than the melting point of solder;

means, connected to said source, for directing a stream of said gas at a fixed point in space;

means for alternatively positioning said member at said point and withdrawing said member from said point;

means, connected to said positioning means, for rotating said member while said member is positioned at said point;

enclosure means for enclosing said point and said directing means, said enclosure means having an aperture through which said member is inserted and withdrawn by said positioning means;

the atmosphere within said enclosure means being oxygen-free and maintained at a positive pressure with reference to the atmospheric pressure outside of said enclosure by said directing means of said source of oxygen-free, pressurized, heated gas during the period that said member is being prepared.

2. A device as set forth in claim 1 wherein said gas directing means includes:

a first means for channelling a first component stream of said gas in a first direction at said point;

a second means for channelling a second component stream of said gas in a second direction at said point;

said first and second directions being different.

3. A device as set forth in claim 2 wherein:

said first direction is down the position Y-axis toward the origin of an imaginary coordinate system having said point as the origin of said coordinate system; and said second direction is from below the X-axis toward said origin.

4. A device as set forth in claim 3 wherein said second direction from below the X-axis forms an angle of 15° with the x-axis.

* * * * *